US011072125B1

(12) United States Patent
Weber et al.

(10) Patent No.: US 11,072,125 B1
(45) Date of Patent: Jul. 27, 2021

(54) REFLECTIVE COATING FOR MATERIAL CALIBRATION

(71) Applicant: Inkbit, LLC, Medford, MA (US)

(72) Inventors: Aaron Weber, Arlington, MA (US);
Desai Chen, Arlington, MA (US);
Harrison Wang, New York, NY (US);
Gregory Ellson, Cambridge, MA (US);
Wojciech Matusik, Lexington, MA (US)

(73) Assignee: Inkbit, LLC, Medford, MA (US)

( * ) Notice: Subject to any disclaimer, the term of this patent is extended or adjusted under 35 U.S.C. 154(b) by 0 days.

(21) Appl. No.: 16/936,786

(22) Filed: Jul. 23, 2020

(51) Int. Cl.
*B29C 64/393* (2017.01)
*G06N 20/00* (2019.01)
*B33Y 50/02* (2015.01)
*B33Y 30/00* (2015.01)
*G01B 11/00* (2006.01)

(52) U.S. Cl.
CPC ............ *B29C 64/393* (2017.08); *B33Y 30/00* (2014.12); *B33Y 50/02* (2014.12); *G01B 11/00* (2013.01); *G06N 20/00* (2019.01)

(58) Field of Classification Search
CPC ... B29C 64/112; B29C 64/393; B29C 64/386; B29C 64/106; B29C 64/124; B33Y 10/00; B33Y 30/00; B33Y 50/02; G05B 19/4099; G05B 2219/35134; G05B 2219/49007; G05B 2219/49013

USPC .......................................................... 356/445
See application file for complete search history.

(56) References Cited

U.S. PATENT DOCUMENTS

| 5,942,688 A | * | 8/1999 | Kimura | ................ | G01N 29/348 73/598 |
| 10,252,466 B2 | * | 4/2019 | Ramos | .................. | B33Y 50/02 |
| 2012/0255663 A1 | * | 10/2012 | Holroyd | ............... | B29C 64/147 156/64 |
| 2017/0305137 A1 | * | 10/2017 | Flitsch | ................... | B33Y 10/00 |
| 2018/0169953 A1 | * | 6/2018 | Matusik | ............... | B29C 64/393 |
| 2019/0210289 A1 | * | 7/2019 | FrantzDale | ......... | G01B 11/002 |

OTHER PUBLICATIONS

T. Chen, H. P. A. Lensch, C. Fuchs and H. Seidel, "Polarization and Phase-Shifting for 3D Scanning of Translucent Objects," 2007 IEEE Conference on Computer Vision and Pattern Recognition, Minneapolis, MN, USA, 2007, pp. 1-8, doi: 10.1109/CVPR.2007.383209.

* cited by examiner

*Primary Examiner* — Sunghee Y Gray
(74) *Attorney, Agent, or Firm* — Occhiuti & Rohlicek LLP (57) ABSTRACT

A method includes generating correction data for a construction material that is used by an additive-manufacturing machine to manufacture an object. This correction data compensates for an interaction of the construction material with first radiation that has been used to illuminate the construction material.

15 Claims, 11 Drawing Sheets

REFLECTIVE COATING FOR MATERIAL CALIBRATION

BACKGROUND OF THE INVENTION

Additive manufacturing refers to fabricating an object by selective addition of material. A typical additive manufacturing process works by slicing a digital model of an object into layers. A fabrication apparatus receives data representing the layers and causes the layers to be deposited, starting with a bottom layer and ending with a top layer. Additive manufacturing is rapidly gaining popularity in a variety of markets including automotive, aerospace, medical devices, pharmaceuticals, and industrial tooling.

One known method for additive manufacturing includes having a printhead mounted on a gantry. The printhead deposits droplets of liquid printable resins at different locations within a "build volume" to fabricate an object that is supported by a "build platform." In some cases, the printhead moves relative to the build platform. In other cases, the build platform moves relative to the printhead. An apparatus of this type is sometimes called a "3D printer."

Because of various random errors that can occur during such a process, it is useful to be able to inspect the object as it is being manufactured. A vigilant and on-going inspection of this type allows errors to be fixed in real time, thus reducing the possibility of irretrievable defects that would require discarding the object.

Of particular importance is the ongoing inspection of the object's exposed surface, and in particular, its topography. A suitable instrument for determining the topography of such a surface is a profilometer that carries out optical triangulation.

A typical profilometer raster-scans a laser across an object's surface. Based on the reflection of light from the laser and the known geometry, a processor uses data derived from this reflection to calculate the location from which the reflection occurred.

SUMMARY OF THE INVENTION

In one aspect, the invention features a method that includes generating correction data for a construction material that is used by an additive-manufacturing machine to manufacture an object. This correction data compensates for an interaction of the construction material with first radiation that has been used to illuminate the construction material.

A variety of kinds of interaction are possible, either alone or in combination. Examples of different kinds of interactions include sub-surface scattering, sub-surface light transport, absorption, and surface reflectance. As used herein, the singular noun "interaction" is not restricted to a single kind of interaction but can represent a composite of two or more different kinds of interaction.

The process of generating the correction data includes obtaining first scattering data. This scattering data is based at least in part on second radiation that results from having illuminated a first object formed of the construction material with the first radiation. The process also includes obtaining, from a second object, surface data. This surface data is indicative of a surface of the first object. Then, based at least in part on the surface data, the correction data is generated. The correction data thus generated, when applied to the scattering data, transforms the scattering data into what would have been observed had the first radiation scattered entirely off the surface of the first object.

In some practices, the second object is one that has been configured to suppress interaction with the first radiation. In such practices, obtaining the surface data comprises collecting third radiation that encodes information indicative of the second object's surface topography. This third radiation arises from illuminating the second object with the first radiation.

In other practices, obtaining the surface data comprises receiving, from the probe, a signal indicative of the second object's surface topography. This signal is generated as a result of the probe contacting the second object while traversing a path along the second object. An example of a suitable probe is one associated with atomic force microscope.

In other practices, the second object is one that has been scanned using a scanner that has higher resolution than that used to scan the first object.

A variety of construction materials can be used. However, in some practices, the construction material comprises a resin.

Certain practices include the second object having been configured to suppress the interaction by being coated, for example by being coated with a reflective coating, a fluorescent coating, or a reflective coating that has been coated with a fluorescent coating. Among the foregoing practices are those in which the second object is simply the first object after the first object has been coated.

In other practices, the method also includes the step of including access to the correction data as part of a kit. Such a kit includes a plurality of containers, each of which holds a different kind of construction material for use in additive manufacturing. The correction data includes data portions. Each data portion contains correction data that is specific to one of the construction materials. Each of the containers includes an identifier that points to a data portion that is specific to the construction material contained in the container.

In other practices, the kit is as described above but with only one container with only one construction material.

Practices include those in which the container has a machine or human-readable code imprinted or attached thereto. Examples of such a code include a bar code, a QR code, or a set of alphanumeric symbols.

Still other practices include those in which determining the correction data comprises illuminating the second object with the first radiation and collecting third radiation. In some of these practices, the first radiation has a shorter wavelength than the third radiation. In others, the first radiation and the third radiation have a common wavelength.

Also, among the foregoing practices are those in which determining the correction data comprises using a machine-learning system to determine the correction data and those in which the correction data comprises a look-up table. Among these practices include those in which looking up a value in the table that corresponds to a particular observable includes identifying the entry in the table that is a nearest neighbor of that observable based on a suitable metric. Also, among these practices are those that include identifying two or more entries in the table that are closest to that observable based on a suitable metric.

In another aspect, the invention features an apparatus for using instructions representative of an object to selectively deposit construction material to manufacture the object. Such an apparatus includes a printhead having a nozzle that ejects the construction material towards the object and a controller that controls operation of the printhead based at least in part on a depth to a surface of the object. The controller is configured to receive first information and second information. The first information incorrectly characterizes a depth to a surface of the object. The controller is further configured to use the second information in connection with the first information to estimate the depth.

Embodiments include those in which the second information is indicative of the construction material.

In other embodiments, the layers of construction material include layers of different kinds of construction material. In such embodiments, the second information is indicative of the different kinds of construction material.

In still other embodiments, the construction material includes a composite construction material having plural constituents arranged in a spatial distribution. In such embodiments, the second information is indicative of the spatial distribution.

Further embodiments include those in which the second information is obtained from an optical measurement and those in which it is obtained from a contact profilometer.

Still other embodiments include those in which the second information includes information indicative of topography of a surface of the object and those in which it second information represents an interaction of the object with incident radiation and in which the controller is configured to output an estimate of depth to the object based on the first and second information.

In another aspect, the invention features a kit that includes a construction material, a container, and a pointer. The construction material is one that is to be used by an additive-manufacturing machine to form an object. The container holds the construction material. The pointer identifies construction-material data.

In some embodiments, the pointer includes a QR code.

In other embodiments, construction-material data includes calibration data.

In still other embodiments, the construction-material data includes a family of characteristic curves.

Also, among the embodiments of the kit are those in which the construction-material is one of a plurality of construction materials for use by the additive-manufacturing machine, the container is one of a plurality of containers, and the pointer is one of a plurality of pointers. Each of the containers contains a construction material from the plurality of construction materials. The construction-material data includes a plurality of data portions, each of which corresponds to one of the construction materials. Each of the pointers points to one of the data portions.

In another aspect, the invention features illuminating a first object with first radiation and collecting second radiation. The first object is made from a type of material that is to be used by an additive-manufacturing machine. The second radiation results from having illuminated the object with the first radiation. A second object is then illuminated with the first radiation. The second object mimics the first object's form but suppresses the interaction with the first radiation. Illumination of the second object results in third radiation, which is likewise collected. Then, based on the first, second, and third radiation, certain material data is determined. This material data is indicative of interaction of the first radiation with the resin.

Some practices include storing the resin data for use by a kit. This resin data is then stored on a medium for use by the additive-manufacturing machine. The medium is a non-transitory computer-readable medium. In some of these practices, the medium is part of a kit. In others, the medium is one that is accessed by using the kit.

In some practices, the process of determining resin data is carried out using circuitry that is configured to solve a regression problem. A suitable implementation of such circuitry is a neural network.

The determination of the correction data is carried out, in particular, in a non-abstract manner. As used herein, "non-abstract" is hereby defined to mean the converse of "abstract" as that term has been construed by the United States Supreme Court and the Federal Circuit as of the filing of this application. The process of determination is a physical process that consumes energy and generates waste heat. Accordingly, any person who construes this to be an abstract process is a person who has made an error in claim construction.

The computer-readable medium is a tangible medium that is made of matter, most of which is baryonic matter. As such, it has physical attributes, such as mass. The resin data is stored by physically arranging the matter in a particular way that can be detected by a computer. Accordingly, the resin data is physical and non-abstract.

In some practices, providing the second object comprises providing an object that has been coated. Among these practices are those in which the object that has been coated with a reflective coating and those in which it has been coated with a fluorescent coating. Among these are embodiments in which the fluorescent coating is an optical brightener that absorbs UV radiation and fluoresces in the blue portion of the visible range. In still other practices, the object is one that has been coated with a reflective coating that has likewise been coated with a fluorescent coating.

In some embodiments, the resin is one having fluorescent material mixed within it. For such cases, it is useful to coat the second object with fluorescent material identical to that which is mixed with the resin. This will ensure that the second and third radiation have the same wavelength. The coating is preferably thick enough to suppress interaction of the radiation with the bulk material, such as sub-surface scattering interactions. To avoid having a coating that is excessively thick, it is useful to coat the second object with a metallic coat and to then coat the metallic coat with a thin layer of the fluorescent material.

In other practices, determining the resin data includes obtaining calibration data. In such practices, storing the resin data includes writing the calibration data onto the medium. This calibration data provides a basis for correcting for subsurface scattering within the resin.

Yet other practices include incorporating the resin data as part of a kit. Such a kit includes a resin module containing the resin. This resin module is one that is configured to be coupled to the additive-manufacturing machine.

Also, among the practices of the invention are those that include incorporating the resin data as part of the kit that includes a resin module that contains the aforementioned resin and additional resin modules, each of which contains a different kind of resin. The resin modules are all configured to be coupled to the additive-manufacturing machine. In such practices, the resin data includes portions that are specific to each of the resins. Each of resin modules includes an identifier that points to a particular portion of the resin data. The portion pointed to by the pointer is specific to the resin contained in the resin module associated with that pointer.

In some embodiments, the pointer is an optically readable symbol, such as a QR code or a bar code. Accordingly, some practices also include printing such a code. The printed code can then be placed on the resin module so that it can easily be read by a scanner. Also among the embodiments are those in which the pointer is a code that is read by a human user and manually entered in response to a prompt.

In yet other embodiments, the pointer is encoded in an RFID tag, which is then read by a reader at the additive-manufacturing machine.

Embodiments include those in which the resin data is on a disk or memory stick. However, in some embodiments, the resin data is downloaded into the additive-manufacturing machine using a network that is connected to a medium in which the resin data has been stored for download.

Practices further include those in which the first radiation has a shorter wavelength than the third radiation and those in which the first and third radiation have the same wavelength.

Yet other practices include those in which providing the second object comprises providing a second object having a surface topography that matches that of the first object.

Also among the practices are those in which providing the second object comprises coating the first object and using the coated first object as the second object.

In another aspect, the invention features a kit that includes a resin for use by an additive-manufacturing machine, a resin module containing the resin, and a pointer that identifies data concerning the resin within resin data.

Embodiments include those in which the pointer is an optically-readable symbol that can be read by a suitable scanner. Among these are embodiments in which the pointer comprises a QR code and those in which it comprises a bar code.

In some embodiments, the resin data comprises calibration data. In others, it comprises a family of characteristic curves.

In still other embodiments, the resin is one of a plurality of resins for use by the additive-manufacturing machine and the resin module is one of a plurality of resin modules. In such embodiments the pointer is a one of a plurality of pointers. Each of the resin modules contains a resin from the plurality of resins. The resin data includes data for each resin in the plurality of resins. Each pointer points to a corresponding one of the resins.

In some embodiments, the resin data is resident on a data-storage device that is provided with the resin and the resin module, or resin container. In others, the resin data is downloaded.

In another aspect, the invention features an apparatus for using instructions representative of an object to selectively deposit layers of resin to manufacture the object. Such an apparatus includes a printhead having a nozzle that ejects resin towards the object, a controller that controls operation of the printhead, and a profilometer that provides first information to the controller. The first information incorrectly characterizes a depth to the object. Such an apparatus further includes a machine-learning system coupled to the controller. This machine-learning system provides second information to the controller. The second information represents subsurface-scattering properties of the object. The controller is configured to output an estimate of depth to the object based on the first and second information.

In another aspect, the invention features using an additive-manufacturing process to manufacture an object. Using such an additive-manufacturing process includes using instructions representative of the object to cause a printhead to selectively deposit layers of resin to manufacture the object, receiving information that incorrectly characterizes said depth, receiving, from a machine-learning system, a parameterized transform that compensates for subsurface-scattering properties of said object, based on said first information and said parameterized transform, obtaining an estimate of said depth, and, using said estimate, controlling said depth.

These and other features of the invention will be apparent from the accompanying description and the accompanying figures, in which:

BRIEF DESCRIPTION OF THE DRAWINGS

FIG. 1 shows an additive-manufacturing apparatus having an edge profilometer that includes a camera and an emitter;

FIG. 2 shows the camera in FIG. 1 detecting an edge;

FIG. 3 shows the apparatus of FIG. 1 with the object being manufactured having been moved in a first direction;

FIG. 4 shows the apparatus of FIG. 1 with the object being manufactured having been moved in a second direction, which is opposite to the first direction shown in FIG. 3;

FIG. 5 shows an edge profilometer with two cameras;

FIG. 6 shows an edge profilometer having two emitters;

FIG. 7 shows the edge profilometer of FIG. 5 circumventing an obstacle;

FIG. 8 shows the edge profilometer of FIG. 6 circumventing an obstacle;

FIG. 9 shows an edge profilometer having two hybrid components, each of which incorporates both a camera and an emitter;

FIG. 10 shows data obtained from the sensing array of the camera shown in FIG. 2;

FIG. 11 shows a curve that has been fit to the data shown in FIG. 12;

FIG. 12 illustrates the effect of scattering centers beneath the surface of the object in FIG. 1;

FIG. 13 shows an idealized image of what the camera detects;

FIG. 14 shows the image of FIG. 15 after having been blurred as a result of subsurface scatter;

FIG. 15 shows the object in FIG. 14 but coated with a metal layer;

FIG. 16 shows an edge profile and a family of curves for convolution with the edge profile to identify a measured depth.

DETAILED DESCRIPTION

Figure 1:
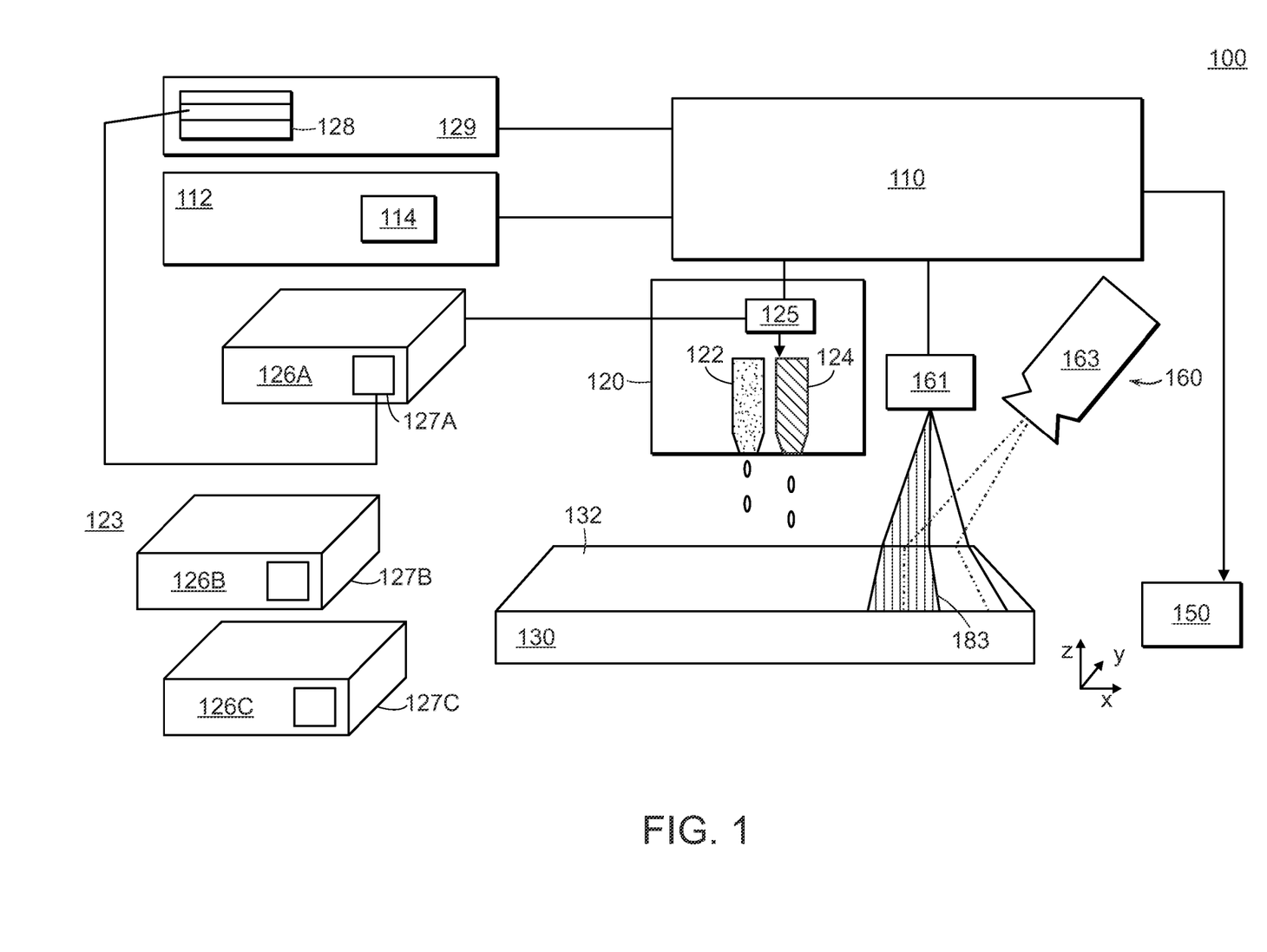

FIG. 1 shows an additive-manufacturing apparatus 100 having a print head 120 to be used during additive manufacturing of an object 130 that rests on a build platform (not shown). In a typical apparatus, the print head 120 includes plural nozzles 122, 124 for jetting different resins. Examples of such an additive-manufacturing apparatus can be found in U.S. Pat. No. 10,252,466 and in U.S. Patent Publ. 2018/0169953, the contents of which are incorporated herein by reference.

During the course of an object's manufacture, an actuator 150 causes motion of the object 130 relative to the print head 120. In the illustrated embodiment, the actuator 150 translates the object 130 in a vertical direction z and in two horizontal directions x, y. The two horizontal directions define a "transverse plane."

To promote more accurate manufacture, a controller 110 relies on feedback to control both the operation of the print head 120 and the movement imparted by the actuator 150. Such a controller 110 relies at least in part on information on the topography of the object's surface 132. This information is derived from an edge profilometer 160 that includes an emitter 161 and a camera.

In some embodiments, the additive-manufacturing apparatus 100 includes a machine-learning system 112 that, in some implementations, includes a neural network 114. The operation of these components is described in detail below.

In other embodiments, the additive-manufacturing apparatus 100 includes a mixer 125 that draws resins from in installed resin module 126A. The installed resin module 126A is taken from a kit 123 that includes plural resin modules 126A-126C.

Affixed on each of the resin modules 126A-126C in the kit 123 is a corresponding pointer 127A-127C that identifies the particular resin contained in that resin module 126A-126C. Characteristics of each resin are contained in resin data 128 stored in a materials database 129. This materials database 129, along with the resin data 128, comes as part of the kit 123.

A suitable pointer 127A-127C is one encoded in a bar code or a QR code. The controller 110 thus reads the pointer 127A of the installed resin module 126A and identifies the particular resin that is contained within it. As a result, the controller 110 accesses the relevant resin data 128 in connection with operating the printhead 120 and in connection with calibrating the printhead 120 to accommodate inks having different properties. In a typical embodiment, the emitter 161 is an LED pattern-projector that generates an in-focus image of an optical slit or mask on the object 130. As a result, the emitter 161 illuminates the object's surface 132 with a pattern having an edge 183. This provides a sharp transition between illuminated and non-illuminated portions of the object's surface 132.

Figure 2:
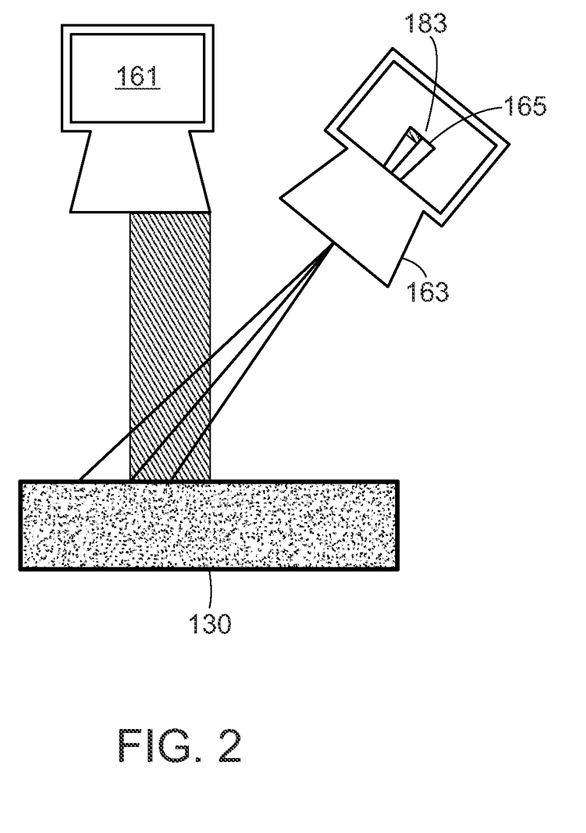

The camera 163 records the location of the edge 183. In a typical embodiment, the camera 163 is an area-scan camera. Such a camera 163 has an array of sensors that defines an array 165, which is shown in FIG. 2.

In FIG. 1, the emitter 161 is an overhead emitter that illuminates the object 130 from the vertical direction while the camera 163 views the object 130 from an angle. However, in some embodiments, these are swapped so that the camera 163 is an overhead camera that views the edge 183 from a vertical direction and the emitter 161 illuminates the object from an angle. The main distinction is that when the emitter 161 is overhead, measurement of depth does not depend on the location of the region being inspected in the transverse plane. However, if the emitter 161 is not overhead, then this is no longer the case.

More generally, the illustrated edge profilometer 160 features a first component at a first elevation angle and a second component at a second elevation that is less than the first elevation angle. The elevation angle is defined such that a point directly overhead as seen from the object, i.e., a point at the zenith, has an elevation angle of 90° and a point that would correspond to the horizon has an elevation angle of 0° degrees or 180°. In a preferred embodiment, the first elevation angle is ninety degrees and the second is either in a first interval or a second interval. The first interval is (90°, 180°) and the second interval is (0°, 90°). The use of parentheses indicates an open interval that does not include its endpoints. In such embodiments, the first component is referred to as an "overhead" component and the second component is referred to as an "off-axis" component.

If the first component is an emitter 161, then the second component is a camera 163. If the first component is a camera 163, then the second component is an emitter 161.

As shown in FIG. 2, the camera 163 includes an array 165 of photosensitive elements, each of which defines a pixel. Each pixel $P_{m,n}$ is identified by a row index m and a column index n. The row index m identifies a particular row to which the pixel belongs. The column index n identifies a particular column to which the index belongs. For a particular row index m', the pixels $P_{m',n}$ $\forall$n define the "associated column" of row m'. Similarly, for a particular column index n', the pixels $P_{m,n'}$ $\forall$m define the "associated row" of column n'.

An image of the pattern forms on this array 165 with the pattern's edge 183 falling at a particular location along the array 165. For a known geometry, the location of the edge 183 along this array 165 provides a basis for estimating the z-coordinate of the object's surface 132 in the particular region of the object 130 that is being inspected. The value of this z-coordinate will be referred to herein as "depth." This value could, of course, also have been referred to as a "height," the distinction between the two being a result of an arbitrary choice of a datum. Thus, although the term "depth" is used herein for consistency, the value of the z-coordinate is ultimately a distance to a reference datum.

In general, the depth of the object's surface 132 changes over time. This can result from activity by the print head 120, which deposits resin onto the object 130 and thus reduces the depth, or from movement by the actuator 150. In either case, the edge's location moves along the sensing array 165. This movement provides a feedback signal that the controller 110 relies upon for controlling either or both the actuator 150 and the print head 120.

To improve scanning rate, it is useful for the array 165 to be relatively small. After all, the process of optical triangulation upon which the controller 110 relies requires many data samples to be processed in real-time. Thus, an excessively large array 165 imposes a greater computational burden. On the other hand, as the array 165 becomes smaller, it becomes increasingly likely that the edge 183 will no longer fall within the array 165.

In some embodiments, the camera 163 has an array 165 with a selectable length. This length depends in part on the desired region-of-interest. Since the array 165 is formed by a set of adjacent rows of pixels, this can be implemented by enabling only a subset of the rows. Such an embodiment provides the opportunity to trade scanning speed for depth-measurement range. To measure a greater range of depth, the array 165 can be made longer by re-enabling selected pixels. However, since frame rate depends on how many rows are being used in the array 165, a longer array 165 will cause a smaller frame rate.

Figure 3:
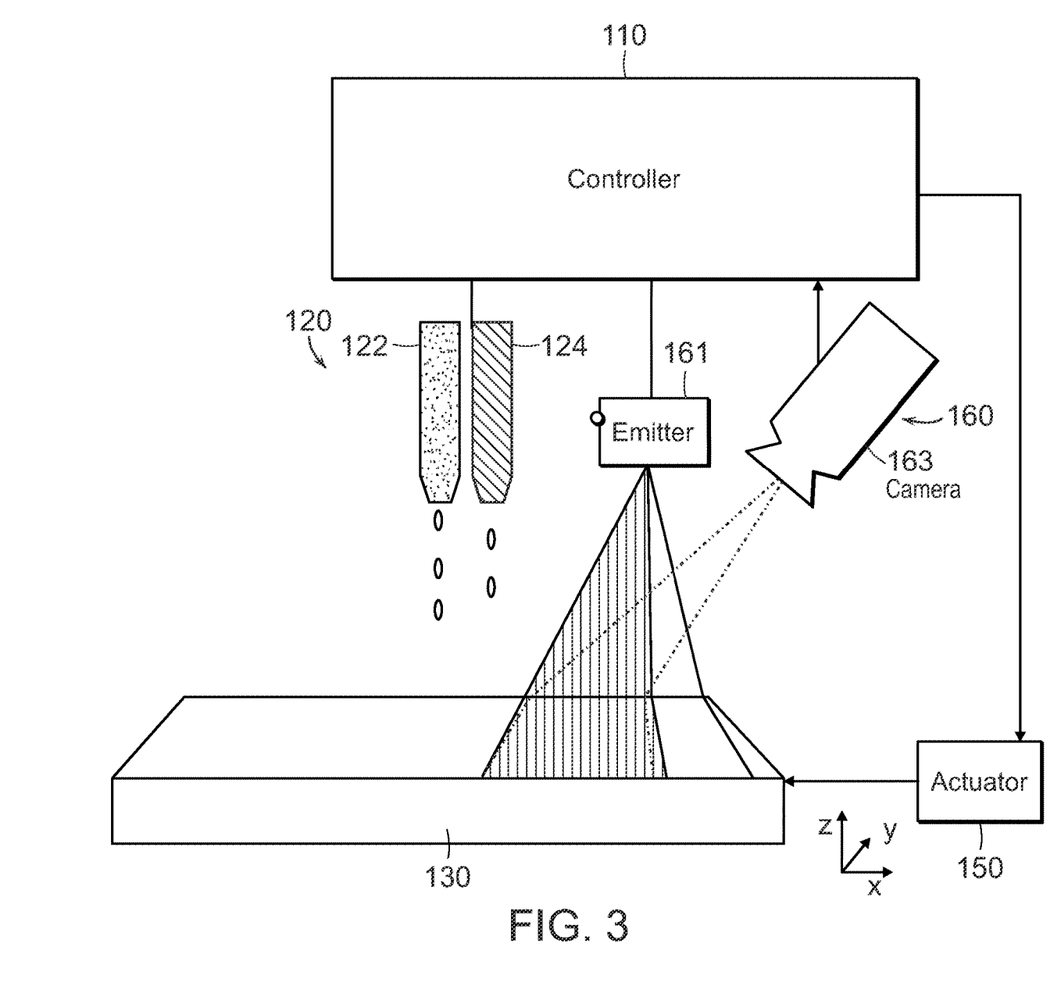
Figure 4:
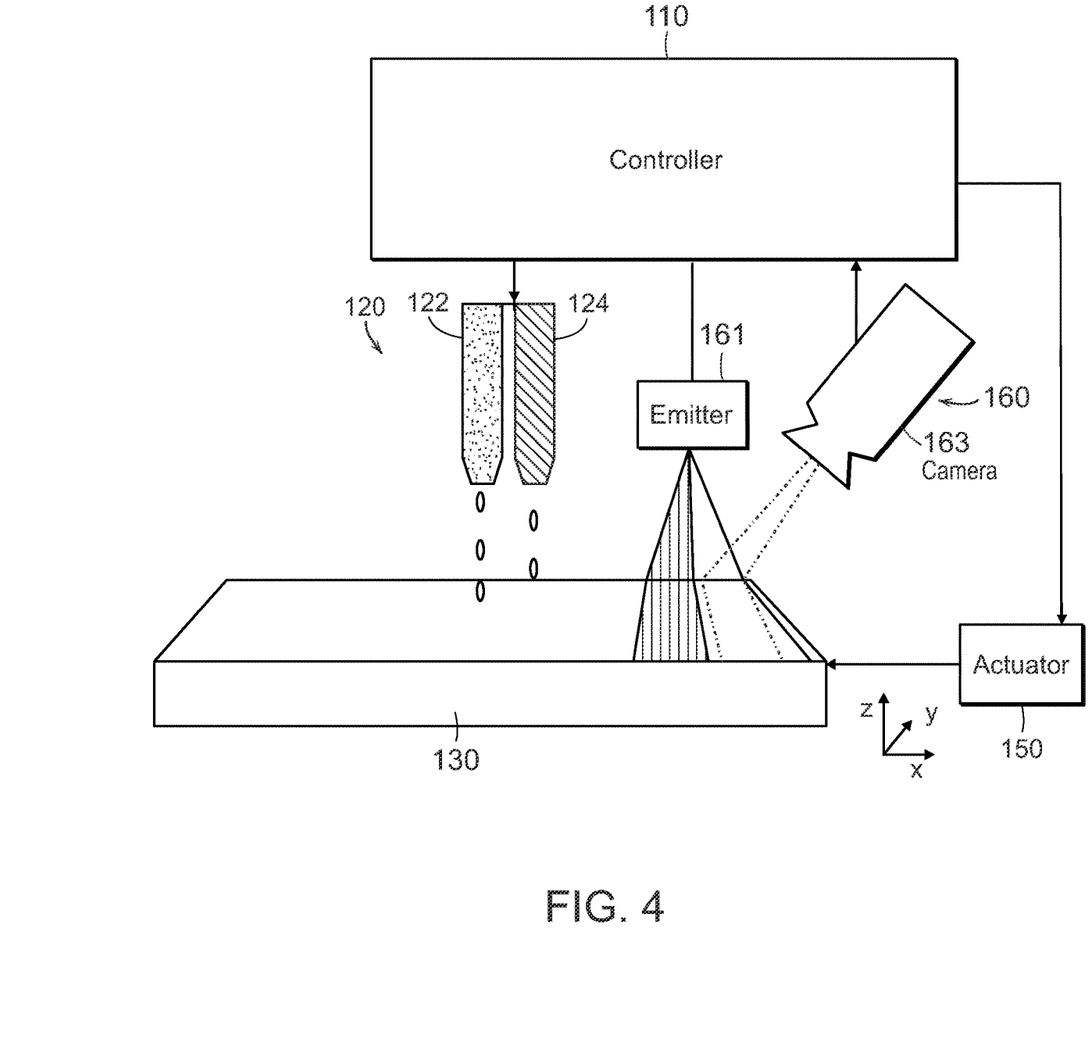

For example, in the situation shown in FIG. 3, the pattern spans the camera's entire field-of-view. As a result, the pattern spans the entire array 165. This means that the edge 183 cannot be seen. Therefore, the depth cannot be determined. Conversely, in the situation shown in FIG. 4, the pattern misses the camera's entire field-of-view. As a result, the pattern misses the entire array 165. This means that the edge 183 cannot be seen and therefore the depth cannot be determined. The length of the array 165 determines the range over which depth can be detected.

Figure 5:
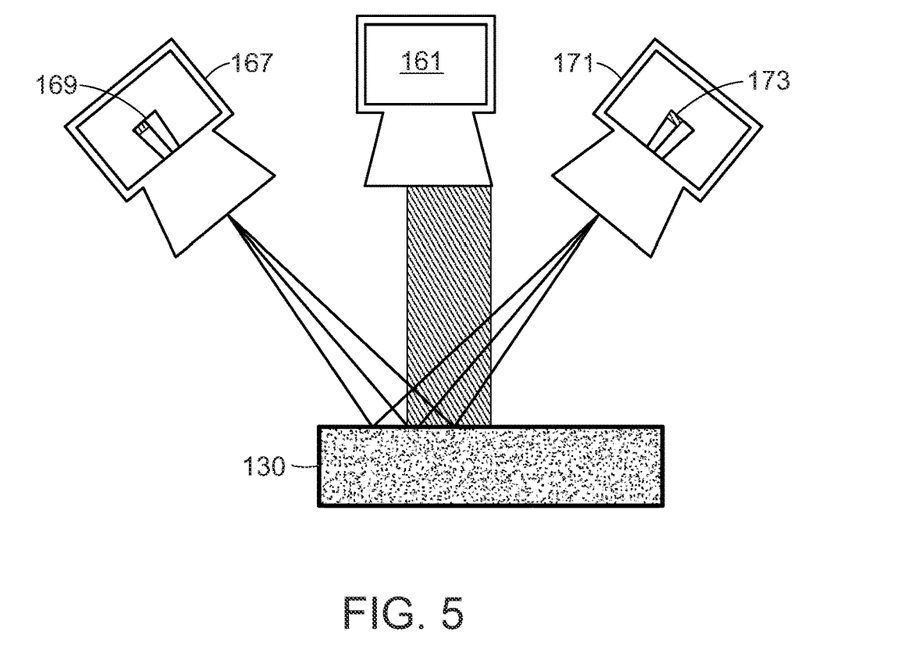
Figure 6:
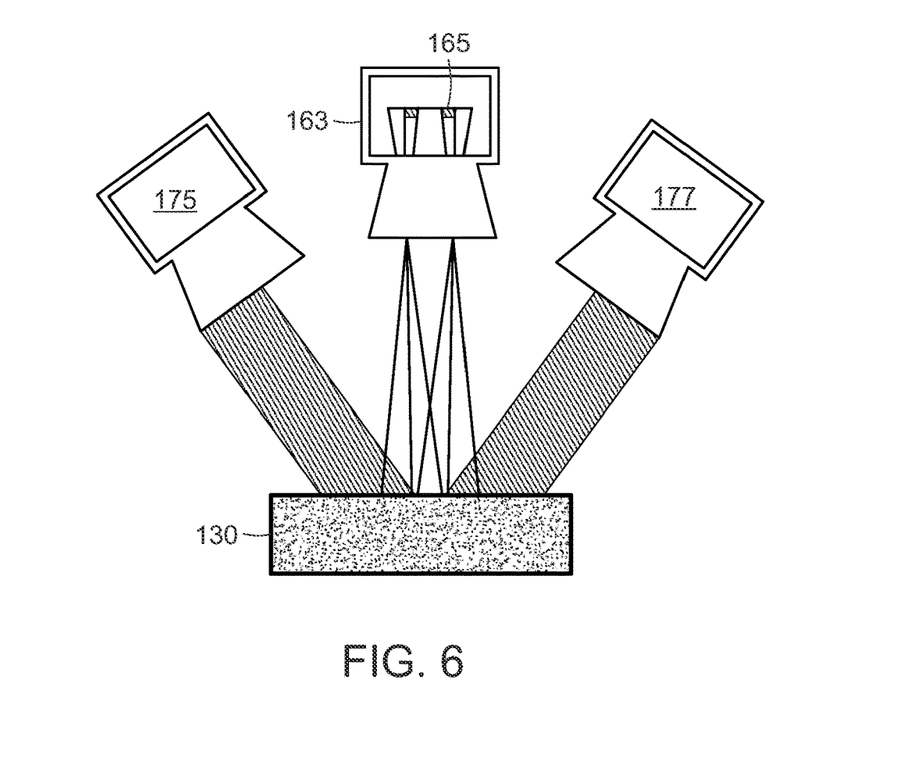

A useful feature of the edge profilometer 160 is that even when the edge 183 falls outside the array 165, it is still possible to distinguish between an array 165 that is fully illuminated from one that is not illuminated at all. This distinction provides the controller 110 with information concerning which side of the array 165 the edge 183 has surpassed. In particular, this information tells the controller 110 whether the area being inspected by the camera 163 is too high or too low to see the edge 183 and hence, how to move the object 130 to bring the edge 183 back into view. In some cases, this information tells the controller 110 whether or not to deposit more resin. The edge profilometers 160 illustrated thus far each have an overhead component and an off-axis component. Alternative embodiments feature redundancy in the off-axis component. For example, FIG. 5 shows an embodiment having an overhead emitter 161 and a pair of off-axis cameras 167, 171 with corresponding first and second arrays 169, 173. FIG. 6 shows an embodiment with an overhead camera 163 and a pair of off-axis emitters 175, 177.

The embodiments shown in FIGS. 5 and 6 are particularly useful for avoiding difficulties caused by shadowing. In general, there are two kinds of shadowing that occur: obstruction of a camera's view and interception of an emitter's beam.

Figure 7:
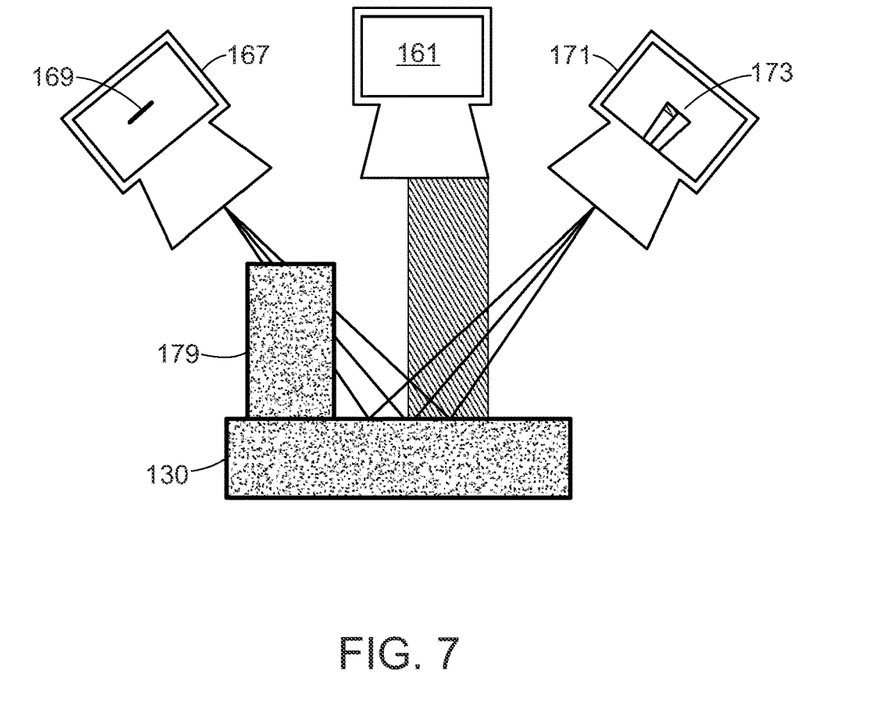

FIG. 7 shows an example of an obstacle 179 that obstructs a camera's view of the object 130. The redundancy in cameras 167, 171 in FIG. 5 provides a way for the controller 110 to circumvent the difficulty caused by the obstacle 179 in FIG. 7.

Figure 8:
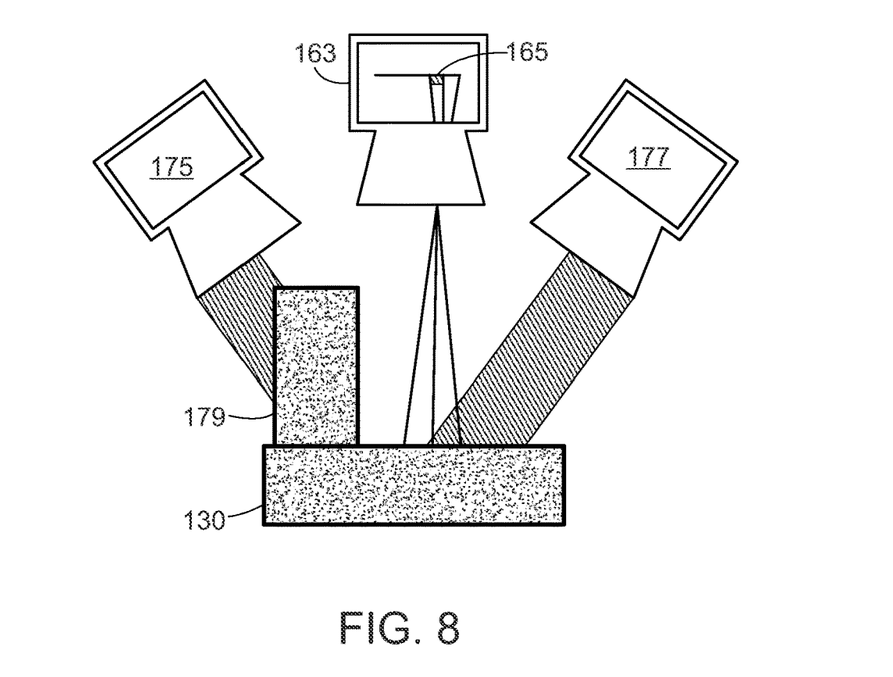

FIG. 8 shows an example in which an obstacle 179 intercepts an emitter's beam, thus making it impossible to illuminate the object 130. The redundancy of the emitters 175, 177 shown in FIG. 6 allows the controller 110 to circumvent the difficulty caused by the obstacle's interception of the emitter's beam, as shown in FIG. 8.

Figure 9:
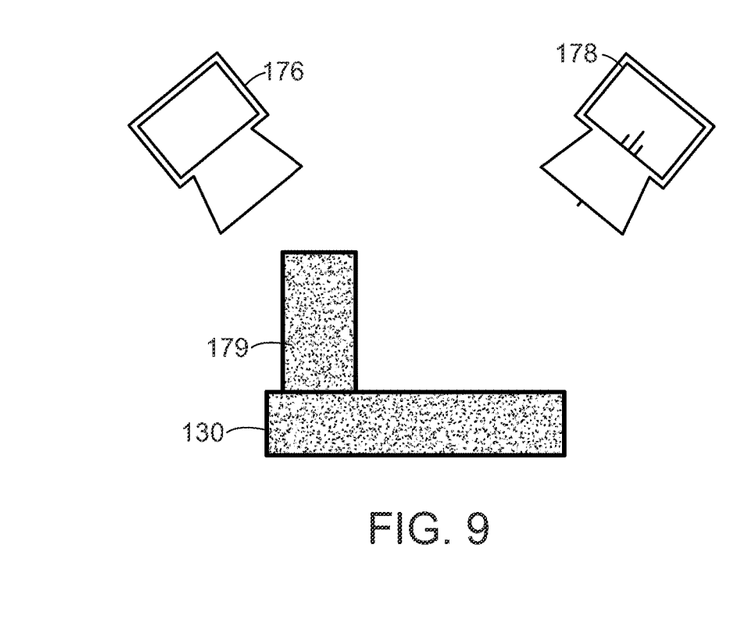

In another embodiment, shown in FIG. 9, the profilometer 160 includes a pair of hybrid components 176, 178 each of which includes components to enable it to function as both a camera and as an emitter. This embodiment is useful when there is insufficient space to have three separate components.

The camera's field of view covers a particular range of rows and columns. At each row and column, there exists a pixel intensity. These pixel intensities collectively define a profile. A column profile shows pixel intensities along a particular row's associated column. A row profile shows pixel intensities along a particular column's associated row.

Figure 10:
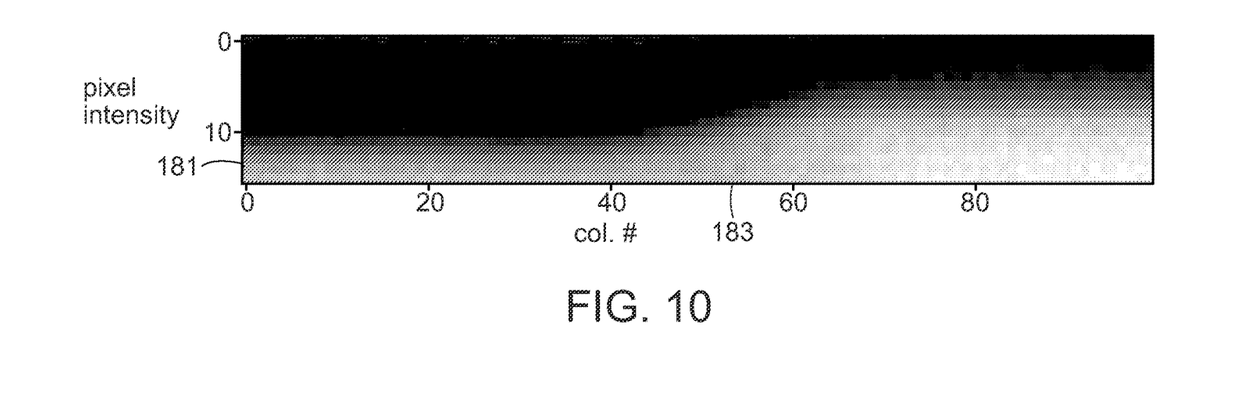

FIG. 10 shows a column profile 181 for a particular row's associated column. The column profile 181 shows pixel intensity at each pixel in that row's associated column. As is apparent, the edge 183 is not as distinct as one might have hoped.

Figure 11:
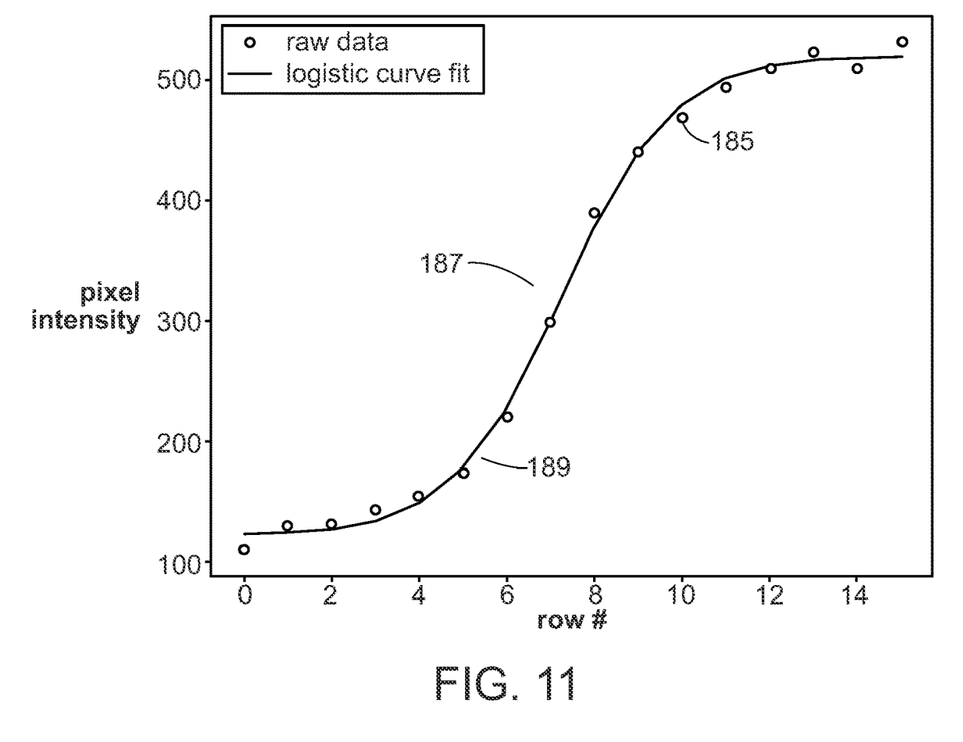

FIG. 11 shows measurements of a row profile 185 showing pixel intensity at each pixel along a particular column's associated row. Ideally, the row profile 185 should reveal a distinct step 187. The row at which this step 187 occurs would then provide a precise depth estimate.

Figure 12:
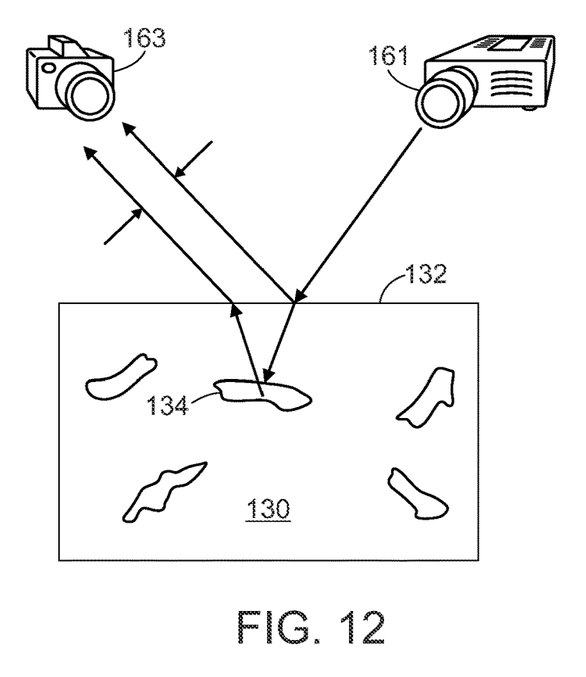

However, in many cases, the material from which the object 130 is made is slightly translucent, as shown in FIG. 12. In such a material, there are often subsurface scattering centers 134. The resulting subsurface scattering blurs what should have been a distinct step 187.

For each column shown in the column profile 181, it is useful to estimate the step's location in that column's associated row. This is carried out by a regression that fits the measurements of the row profile 185 to a logistic curve 189 from a family of logistic curves. In the illustrated embodiment, the family of logistic curves is given by $$f(x) = A + \frac{B}{1 + e^{-k(x-x_0)}}$$

where A and B define the extrema of the logistic curve 189, k is the slope, and $x_0$ is the midpoint. The row that is closest to being at the midpoint of the logistic curve 189 can be used as a surrogate for the depth of the object's surface at the lateral location being measured. In addition to the row profile 185, FIG. 11 shows the particular logistic curve 189 from the family of curves that best fits the row profile 185 along a particular column's associated row. Different logistic curves 189 are likely for other columns.

Figure 13:
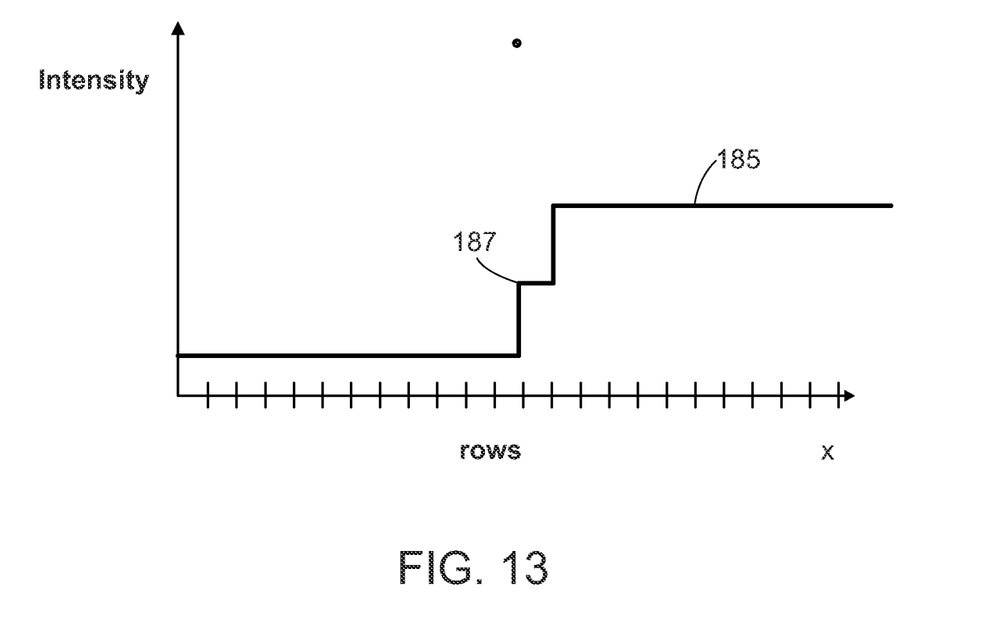
Figure 14:
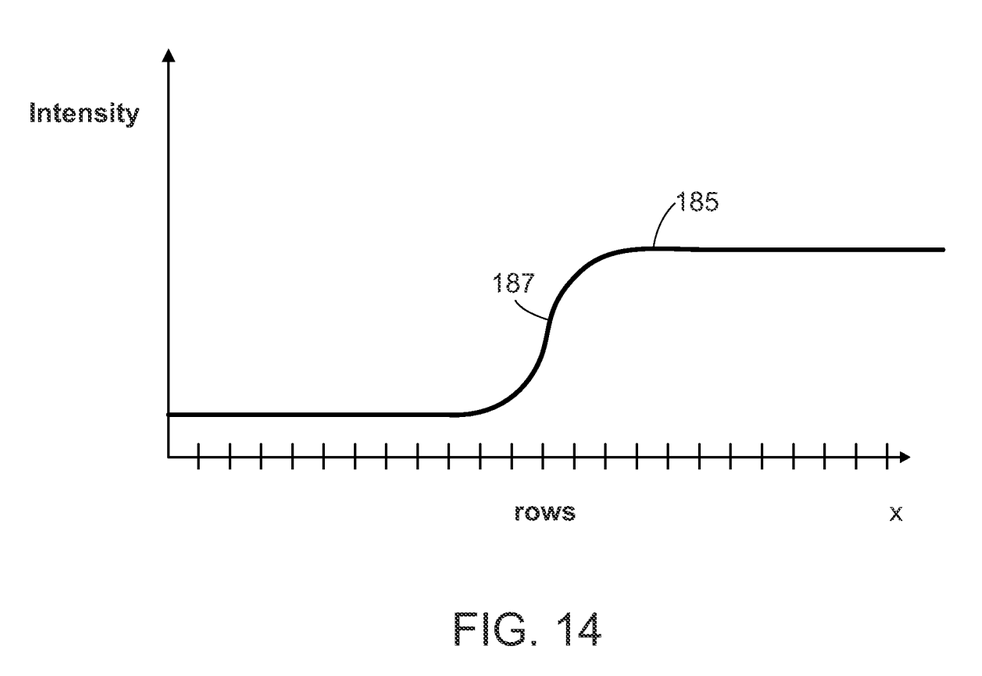

In the absence of subsurface scatter and other noise sources, including noise resulting from having a camera 163 and/or an emitter 161 with imperfect focus, the camera 163 should record a distinct step 187 as shown in FIG. 13, with the location of the step 187 being indicative of a particular depth of the object's surface at the location under inspection. Because the array 165 is divided into individual pixels, a binary transition between illuminated and non-illuminated regions will only occur if the surface's depth is such that the pattern's edge falls exactly at the boundary between two pixels. In most cases, it will fall somewhere within a pixel, thus causing that pixel to be only partially illuminated. Thus, the step 187 is actually resolvable into a pair of adjacent half-steps. In practice, subsurface scatter degrades resolution so that the step 187 shown in FIG. 13 blurs into a somewhat indistinct step 187 as shown in FIG. 14.

In FIG. 13, the vertical extent of the first half-step of the step 187 depends on where exactly within a pixel the edge 183 actually lands. If the edge has fallen so that most of the pixel is illuminated, the first half-step will be quite high. Otherwise, it will be low.

The first half-step's extent therefore defines an "intermediate value." To the extent this intermediate value can be estimated from the column profile 181 shown in FIG. 10, it provides a way to obtain sub-pixel resolution. In particular, such resolution can be obtained by using a mapping function that maps the closed interval [0, 1] to fractional disparity values. In the simplest case, the mapping function is linear. However, non-linear functions are also possible. An example of a mapping function is:

$$\text{depth} = \frac{\text{value} - \text{low\_value}}{\text{high\_value} - \text{low\_value}}$$

The illustrated column profile 181 can be viewed as a vector of intensity values $(x_1, x_2, \ldots x_n)$. This vector is referred to herein as the "edge vector" and denoted by "x". The edge profilometer 160 provides this vector to the controller 110. The controller 110 then uses a mapping function D(x), sometimes referred to as a "parametrized transformation," to transform the edge vector x into a measured depth.

Referring back to FIG. 12, the subsurface scattering centers 134 create another problem beyond simply blurring the edge 187 shown in FIG. 11. These scattering centers also 134 corrupt the reflection in a way that alters the actual surface's perceived location. Since the scattering centers 134 are below the surface, the object's surface 132 appears lower than it actually is. Thus, the location of the step 187, even if it were sharper than that shown in FIG. 11, would still be misleading. Moreover, this error cannot easily be compensated for using the regression method discussed in connection with FIG. 11. However, a judicious choice of mapping function D(x) can compensate for this difficulty.

Deriving a mapping function D(x) begins with capturing ground-truth data and providing it to the machine-learning system 112 shown in FIG. 1. This data can be acquired in a variety of ways.

A first way to capture ground-truth data is to use an alternate three-dimensional scanner. Examples include a contact scanner or contact profilometer, a micro-CT scanner, an atomic force microscope, an OCT scanner, and a confocal 3D-scanner. Whichever alternate scanner is chosen should have a resolution no less than that of the edge profilometer 160.

When using an alternate scanner, it is particularly useful to spatially register the data obtained from the alternate scanner to that obtained by the edge profilometer 160. Registration in the transverse directions is easily accomplished using fiducial markers or, equivalently, by registering features in the surface 132. However, because of subsurface scatter, registration in the vertical direction is more difficult. This is because alternative scanners do not experience subsurface scattering in the same way. For example, an atomic force microscope does not experience subsurface scattering at all.

A suitable method for addressing the problem posed by vertical registration is to use a test object that mimics the actual object's form but suppresses subsurface scattering. A suitable test object would be a metal plate.

By using a metal plate, it is possible to compensate for subsurface scattering by comparing the depth data from the edge profilometer 160 in the region with no subsurface scattering to the depth data from the external high-resolution scanner.

Figure 15:
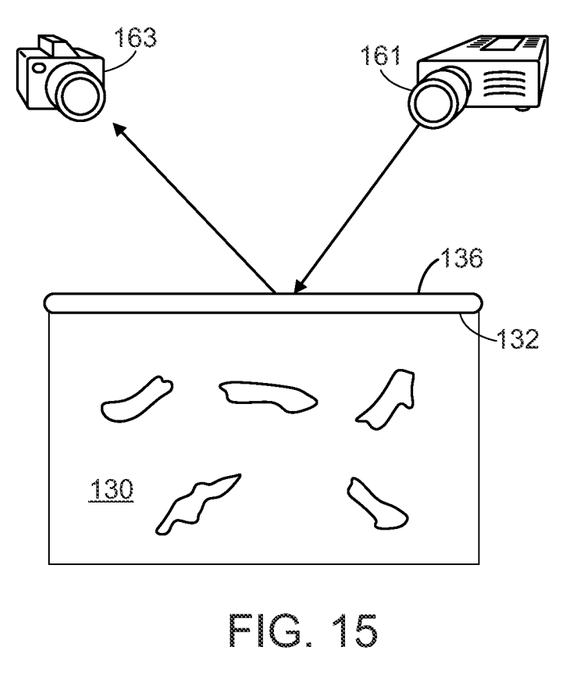

Another method of obtaining ground-truth data avoids using an alternate scanner altogether. This method includes printing the object 130 and capturing corresponding scan data using the still-uncoated object 130, as shown in FIG. 12. The method proceeds with applying a metal coating 136 to the object 130, as shown in FIG. 15. Such a coating prevents light from penetrating the surface 132. A coating as thin as two microns or less is sufficient. Such a coating can be applied using chemical vapor deposition or sputtering.

An optional further step is that of coating the object 130 with a thin layer of a fluorescent material. Examples of a suitable material include an optical brightener that fluoresces in response to incident light and does so in the visible range so that the resulting fluorescence can be captured by the camera. Alternatively, the coating can be a highly-scattering material to provide a stronger signal to the camera 163.

The foregoing methods are particularly useful for obtaining calibration data that can be used in the kit 123, and in particular, in the materials database 129 as part of the resin data 128. In such cases, the procedure would include making a measurement using a slab of the bulk material, coating the slab with a metal coating 136 or a fluorescent layer, and making another measurement. The difference between the two measurements is indicative of the extent of subsurface scattering.

Figure 16:
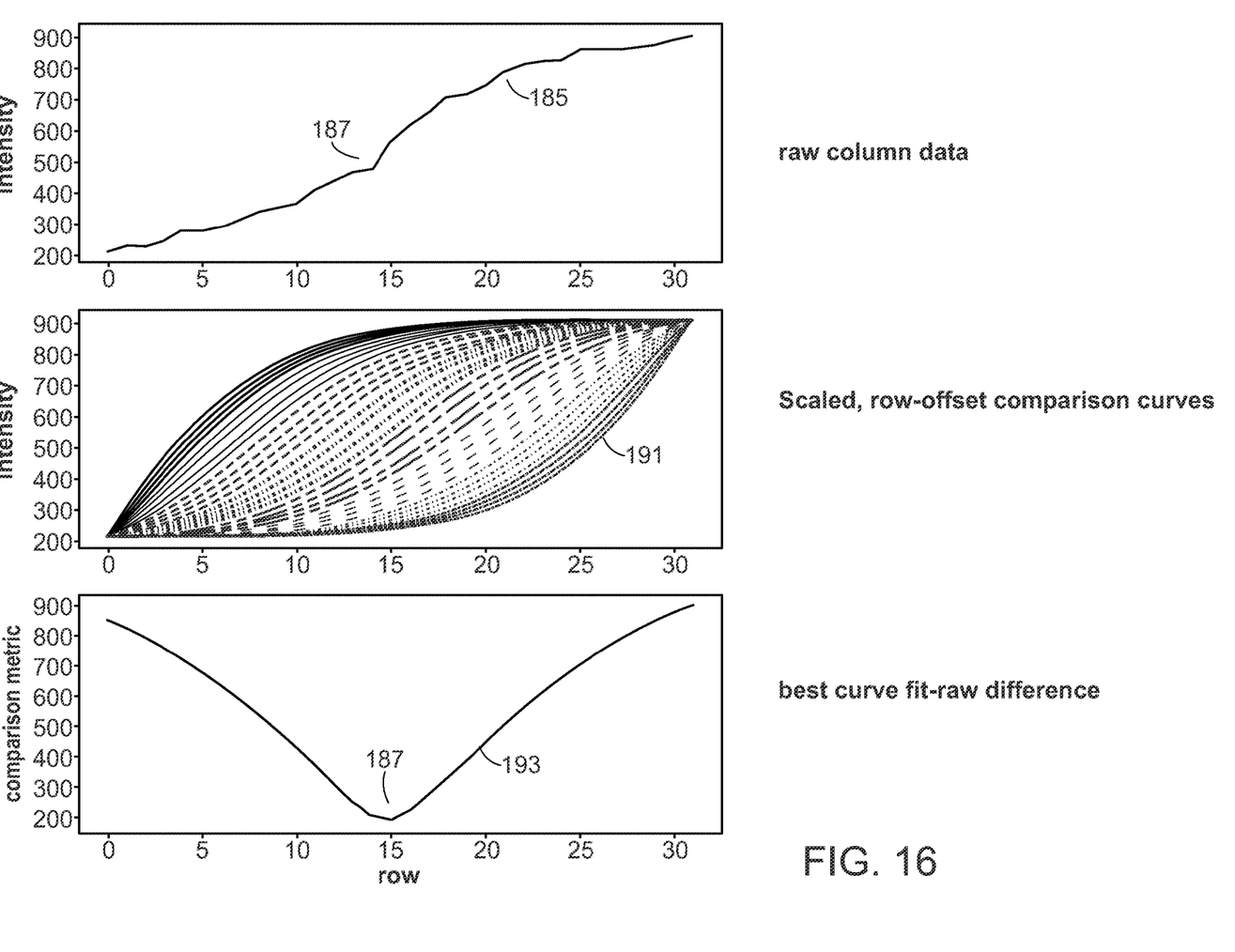

In either case, the method continues with scanning the now-coated object 130, using the same scanning setup. For each surface point, corresponding row profiles 185 such as those shown in FIGS. 15 and 16 are generated. Ground-truth data can then be obtained by correlating matching row profiles 185.

Another difficulty that arises is inhomogeneous subsurface scattering. One way this occurs is in the case of an object 130 that is made of different materials in different regions. Another way this can arise is by coupling of light to structures outside of the object 130. For example, there may be relatively thin parts of the object 130 that rest on the build platform. When scanning these regions, it is quite possible for light to pass all the way through the object 130 and reflect off the build platform itself. As a result, the optical properties of the build platform come into play. It is therefore particularly useful for the mapping function $D(x)$ to work reliably by providing reliable depth estimates for measurements made under such conditions.

One way to solve this problem is to devise a universal mapping function $D(x)$ that correctly computes the depth value for different types of row profiles 185 corresponding to different material types or different spatial distributions of materials.

Another way to solve this problem is to carry out an equalization procedure. This can be done by adjusting the additives in different materials such that their row profiles 185 are as similar as possible. This can include adjusting the types of additives and the concentrations of those additives. Since all parts of the structure would have roughly the same subsurface scattering properties, this would allow the same mapping function to be used regardless of the material from which the area under measurement was made.

Alternatively, one can avoid the use of additives altogether by determining multiple types of mapping functions $D_i(x)$ and choosing the correct mapping function based on which portion of the object is being inspected. For example, in an object that is made of a build material and a support material, there would be two mapping functions: $D_{BUILD}(x)$ and $D_{SUPPORT}(x)$. The controller 110 would then select the correct mapping function based on what is being scanned. This choice could be made based on advance knowledge of the object and knowledge of the regions to be scanned. It could also be made based on spectroscopic data that is collected in real time during the scanning process itself.

One way to convert a row profile 185 into actual depth data is to fit a logistic curve 189 and to then identify its midpoint. While this method is effective, the computationally intensive nature of curve fitting can tax the controller's real-time processing ability. Additionally, this method imposes the additional step of having to convert the results based on calibrated data.

In an alternative method, illustrated in FIG. 16, the controller 110 convolves a row profile 185 with each curve in a family of pre-computed unit curves 191. Each such pre-computed unit curve 191 corresponds to an expected shape of the row profile 185 for a particular offset, each of which corresponds to a particular depth. The resulting family of pre-computed unit curves 191 thus results in a corresponding set of corresponding offsets.

Preferably, each unit curve 191 has also been scaled to the maximum and minimum values of the row profile 185. By convolving each unit curve 191 with a row profile, it becomes possible to identify the unit curve that most closely matches the row profile 185.

Based on the resulting set of convolutions, it becomes possible to identify a best estimate 193 of the step's location and the corresponding depth value.

A method that relies on convolution with a family of pre-computed unit curves 191 is advantageous because the computational steps for carrying out convolution are simpler and more rapidly carried out than those for carrying out curve fitting. Another advantage that arises is the ease with which it becomes possible to accommodate different materials and different thicknesses. When using the foregoing convolution method, it is only necessary to adjust the choice of unit curves 191.

Since each resin has different properties, it is useful to provide different families of pre-computed unit curves 191. These can be stored in the resin data 128. When a new resin module 126 is made available for the printer's use, the controller 110 uses information in the pointer 127 to identify the portion of the resin data 128 that has the correct unit curves for the resin in that resin module 126.

A suitable method for deriving the mapping function $D(x)$ is to carry out machine learning based on collected edge profiles x and collected disparity vectors y. A machine-learning process would use these vectors to identify a mapping function D that satisfies the property: y=D(x). Depending on the choices of edge profiles x and disparity vectors y, the learned mapping-function could be one that works for a single virtual material, which was made by suitably doping different materials with additives so as to equalize their optical properties. Or the learned mapping-function could be one that works for a particular material, in which case the correct mapping function would have to be selected based on the region being scanned, or it could be one that accommodates variations that result from interaction of the material with adjacent structures, for example the build platform.

A number of different models can be used to model the mapping from an edge profile x to a disparity vector y. Examples of such models include support-vector regression, linear regression, and polynomial regression. Neural networks can also be used. These include single layer networks or multiple layer networks. Additionally, it is possible to use regression trees as well as various random forest methods.

To carry out machine learning using the neural network 114 shown in FIG. 1, one acquires a global data in which each edge profile x is paired with a corresponding disparity vector y: $\{(x_1, y_1), \ldots, (x_m, y_m)\}$. This global data is then divided into training data and validation data.

The neural network 114 uses the training data to successively refine estimates of weights between its nodes. It does so by using a suitable optimization algorithm. An example of such an algorithm is a stochastic gradient descent based on training data.

Having obtained suitable weights, the neural network 114 estimates the resulting model's predictive capacity using the validation data and also provides an estimate of uncertainty in its prediction of depth values.

To promote more efficient computation, it is useful to truncate the edge profile x to include only the edge's immediate neighborhood. The bounds of this neighborhood can easily be estimated using simple thresholding to obtain its approximate end points.

Information from a spatial neighborhood can improve depth estimation. One way to do this is to carry out post-processing steps, such as using a noise-reduction filter to filter the depth data to remove noise from a small spatial neighborhood. A suitable filter is a smoothing filter. Another way is to learn an estimating function based on a vector that has been derived from a small spatial neighborhood of the edge.

What is claimed is:

1. A method comprising:
   generating correction data for a construction material that is used by an additive-manufacturing machine to manufacture a first object, wherein said correction data compensates for an interaction of the construction material with first radiation that has been used to illuminate, wherein generating said correction data includes:
      obtaining first scattering data, said first scattering data being based on second radiation that results from having illuminated said first object with said first radiation, wherein said first object is formed of said construction material,
      obtaining surface data from a second object wherein said second object mimics said first object's surface topography, and wherein said surface data encodes surface topography of a surface of said first object, and based at least in part on said surface data, generating said correction data, wherein said correction data, when applied to said scattering data, transforms said scattering data into what would have been observed had said first radiation scattered entirely off said surface of said first object.

2. The method of claim 1, wherein said second object has been configured to suppress the interaction and wherein obtaining said surface data comprises collecting third radiation that encodes information indicative of said second object's surface topography, said third radiation arising from illuminating said second object with said first radiation.

3. The method of claim 1, wherein obtaining said surface data comprises receiving, from a probe, a signal indicative of said second object's surface topography, said signal being generated as a result of said probe contacting said second object while traversing a path along said second object.

4. The method of claim 1, wherein said second object has been scanned using a scanner that has higher resolution than that used to scan said first object.

5. The method of claim 1, further wherein said construction material comprises a resin.

6. The method of claim 1, wherein said second object has been configured to suppress the interaction by being coated.

7. The method of claim 1, wherein said second object has been coated with a reflective coating.

8. The method of claim 1, wherein said second object has been coated with a fluorescent coating.

9. The method of claim 1, wherein said second object has been coated by a reflective coating that has been coated with a fluorescent coating.

10. The method of claim 1, further comprising including access to said correction data as part of a kit, wherein said kit includes a plurality of containers, each of which holds a different kind of construction material for use in additive manufacturing, wherein said correction data includes data portions, wherein each data portion contains correction data that is specific to one of said construction materials, wherein each of said containers includes an identifier that points to a data portion that is specific to the construction material contained in said container.

11. The method of claim 1, wherein generating said correction data comprises illuminating said second object with said first radiation and collecting third radiation, wherein said first radiation has a shorter wavelength than said third radiation.

12. The method of claim 1, wherein generating said correction data comprises illuminating said second object with said first radiation and collecting third radiation, wherein said first radiation and said third radiation have a common wavelength.

13. The method of claim 1, wherein said second object is said first object after having been configured to suppress the interaction.

14. The method of claim 1, wherein generating said correction data comprises using a machine-learning system to generate said correction data.

15. The method of claim 1, wherein said correction data comprises a look-up table.

* * * * *